US008488062B2

(12) United States Patent
Nakamuta et al.

(10) Patent No.: US 8,488,062 B2
(45) Date of Patent: Jul. 16, 2013

(54) ANALOG-DIGITAL CONVERTING APPARATUS AND CLOCK SIGNAL OUTPUT APPARATUS

(75) Inventors: Koji Nakamuta, Kawasaki (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 423 days.

(21) Appl. No.: 12/720,321

(22) Filed: Mar. 9, 2010

(65) Prior Publication Data
US 2010/0231789 A1 Sep. 16, 2010

(30) Foreign Application Priority Data

Mar. 12, 2009 (JP) .................................. 2009-059998

(51) Int. Cl.
*H03M 1/12* (2006.01)
(52) U.S. Cl.
USPC ............................ 348/572; 348/571; 348/573
(58) Field of Classification Search
USPC .......... 348/537, 572, 531, 540–550; 375/375, 375/376
See application file for complete search history.

(56) References Cited

U.S. PATENT DOCUMENTS

| 4,992,872 | A  | * | 2/1991  | Hartmann et al. | ............ | 348/516 |
| 5,019,907 | A  | * | 5/1991  | Murakoshi et al. | ........... | 348/542 |
| 5,677,743 | A  | * | 10/1997 | Terao et al. | .................... | 348/735 |
| 5,991,350 | A  | * | 11/1999 | Yamamoto | .................... | 375/376 |
| 6,201,578 | B1 | * | 3/2001  | Hosoya | ......................... | 348/572 |
| 6,222,590 | B1 | * | 4/2001  | Makino | ......................... | 348/547 |
| 6,429,901 | B1 | * | 8/2002  | Kiyose et al. | ................. | 348/500 |
| 6,584,574 | B1 | * | 6/2003  | Embree | ......................... | 713/400 |
| 7,456,903 | B2 | * | 11/2008 | Osawa et al. | ................. | 348/572 |
| 7,602,445 | B2 | * | 10/2009 | Miyamoto | .................... | 348/537 |
| 2005/0232385 | A1 | * | 10/2005 | Yoshikawa et al. | ........... | 375/376 |
| 2006/0072040 | A1 | * | 4/2006  | Osawa et al. | ................. | 348/572 |

FOREIGN PATENT DOCUMENTS

| JP | 62-114330 A | 5/1987 |
| JP | 03-076425   | 4/1991 |
| JP | 03-165662 A | 7/1991 |
| JP | 04-021212   | 1/1992 |
| JP | 06-112814   | 4/1994 |
| JP | 09-83354    | 3/1997 |
| JP | 9-238070    | 9/1997 |
| JP | 11-308102 A | 11/1999 |
| JP | 2000-286697 | 10/2000 |

OTHER PUBLICATIONS

Japanese Office Action "Notice of Reasons for Refusal" application No. 2009-059998 dated Mar. 19, 2013.

* cited by examiner

*Primary Examiner* — Jefferey Harold
*Assistant Examiner* — Humam Satti
(74) *Attorney, Agent, or Firm* — Squire Sanders (US) LLP

(57) ABSTRACT

An apparatus includes a voltage controlled oscillator for outputting a clock signal having an oscillation frequency in accordance with an input voltage; a convertor for converting the analog video signal inputted from the exterior into the digital video signal synchronizing with the clock signal outputted from the voltage controlled oscillator; a phase difference detector for detecting a phase difference between the composite synchronizing signal in the analog video signal and a feedback signal which corresponds to the clock signal from the voltage-controlled oscillator; and a voltage control unit for controlling the input voltage of the voltage controlled oscillator to change in response to the phase difference detected by the phase difference detector when the phase difference is within the certain range, and to maintain the input voltage intact when the phase difference is in exceed of the certain range.

8 Claims, 6 Drawing Sheets

ANALOG-DIGITAL CONVERTING APPARATUS AND CLOCK SIGNAL OUTPUT APPARATUS

CROSS-REFERENCE TO RELATED APPLICATION

This application is based upon and claims the benefit of priority of the prior Japanese Patent Application No. 2009-059998, filed on Mar. 12, 2009, the entire contents of which are incorporated herein by reference.

FIELD

The embodiments discussed herein are related to an analog-digital apparatus and clock signal output apparatus.

BACKGROUND

FIG. 1 is a block diagram illustrating a typical clock signal output apparatus.

A known clock signal output apparatus 10 includes a digital phase detector (DPD) 11, an internal high-precision oscillator 12, an analog PLL circuit 13 (APLL), a digital loop filter (DLF) 14, a digital-to-analog (D/A) converter 15, a voltage-controlled oscillator (VCO) 16, and a frequency divider 17.

The digital phase detector 11 counts the phase difference between a reference clock signal REF_CLK and a feedback clock signal FB_CLK and outputs a digital phase difference signal representing the phase difference.

The digital phase detector 11 includes an analog phase detector that outputs the phase difference between a reference clock signal REF_CLK and a feedback clock signal FB_CLK, and a digital counter that counts the phase difference. The phase difference output from the analog phase detector is counted by using the digital counter, and the counted phase difference is output as a digital phase difference signal. For counting performed by the digital counter, a phase difference count clock signal DPD_CLK supplied from the internal high-precision oscillator 12 via the analog PLL circuit 13 is used.

The internal high-precision oscillator 12 is an oscillator for generating a phase difference count clock signal DPD_CLK used in counting the phase difference by using the digital counter in the digital phase detector 11. The phase difference count clock signal DPD_CLK is input to the digital phase detector 11 via the analog PLL circuit 13.

The digital loop filter 14 includes a processor such as a digital signal processor (DSP). The digital loop filter 14 averages error signals generated on the basis of a phase difference detected by the digital phase detector 11 (digital phase difference signal) and outputs the average.

The D/A converter 15 is a converter that converts the error signal output from the digital loop filter 14 into an analog signal and outputs the analog signal. The error signal output from the digital loop filter 14 is converted into an analog voltage value for controlling the oscillation frequency of the voltage-controlled oscillator 16.

The voltage-controlled oscillator 16 is an oscillator used as a slave oscillator. For example, an oscillator including an element such as a varicap diode that has a variable capacitance can be used as the voltage-controlled oscillator 16. By applying the analog voltage value output from the D/A converter 15 across the P-N junction of the varicap diode, a clock signal CLK with an oscillation frequency in accordance with the error signal output from the digital loop filter 14 is output. The clock signal CLK output from the voltage-controlled oscillator 16 is supplied to an electronic device such as a communication device or a video device and is used as a reference clock signal or the like.

The frequency divider 17 receives, as an input, the clock signal CLK output from the voltage-controlled oscillator 16 and outputs a feedback clock signal FB_CLK whose frequency is a fraction of the frequency of the clock signal CLK to the digital phase detector 11.

In the known clock signal output apparatus 10 as above, the clock signal CLK output from the voltage-controlled oscillator 16 is input to the frequency divider 17 and is output as a feedback clock signal FB_CLK whose frequency is a fraction of the frequency of the clock signal CLK to the digital phase detector 11. Using the phase difference count clock signal DPD_CLK supplied from the internal high-precision oscillator 12 via the analog PLL circuit 13, the phase difference between the reference clock signal REF_CLK and the feedback clock signal FB_CLK is counted. The counted phase difference is output as a digital phase difference signal.

The digital loop filter 14 averages error signals generated on the basis of the digital phase difference signal output from the digital phase detector 11, and inputs an error signal serving as the average to the D/A converter 15.

The D/A converter 15 converts the error signal output from the digital loop filter 14 into an analog signal (analog voltage value) and supplies the analog voltage value to the voltage-controlled oscillator 16.

The analog voltage value supplied from the D/A converter 15 to the voltage-controlled oscillator 16 is applied across the P-N junction of the varicap diode, thereby changing the capacitance of the varicap diode. Thus, a clock signal CLK with an oscillation frequency in accordance with the error signal output from the digital loop filter 14 is output from the voltage-controlled oscillator 16.

Accordingly, control is performed so that the frequency of the clock signal CLK output from the voltage-controlled oscillator 16, which is a slave oscillator, becomes synchronized with the reference clock signal REF_CLK.

In the known clock signal output apparatus 10, various improvements for highly accurately controlling the frequency of the clock signal CLK have been made (for example, see Japanese Laid-open Patent Publication Nos. 09-238070 and 2000-286697).

FIG. 2 is a block diagram illustrating a typical analog-digital convert apparatus including an analog-digital converter and the digital output apparatus 10, the analog-digital converter converting an analog video signal into a digital video signal by using the clock signal output from the digital output apparatus 10.

An analog-digital converter (hereinafter will be referred to as an "A/D converter") 20 uses a clock signal supplied from the known clock signal output apparatus 10 as a sampling clock signal used in digitally sampling an analog video signal. Therefore, a clock signal output from the known clock signal output apparatus 10 needs to be synchronized with an analog video signal input to the A/D converter 20.

Here, three types of synchronizing signals are used for a video signal. The three types are a horizontal synchronizing signal (HSYNC) for achieving horizontal synchronization, a vertical synchronizing signal (VSYNC) for achieving vertical synchronization, and a composite synchronizing signal (CSYNC). Among the three types, the horizontal synchronizing signal (HSYNC) is synchronized with an analog video signal input to the A/D converter 20.

The composite synchronizing signal (CSYNC) is a signal combining the vertical synchronizing signal (VSYNC) and the horizontal synchronizing signal (HSYNC) and is given by an AND of the vertical synchronizing signal (VSYNC) and the horizontal synchronizing signal (HSYNC).

In the known clock signal output apparatus 10 illustrated in FIG. 2, the composite synchronizing signal (CSYNC) is used as the reference clock signal REF_CLK.

Therefore, in the known clock signal output apparatus 10, a clock signal generated so as to be synchronized with the composite synchronizing signal (CSYNC) is input as a sampling clock signal to the A/D converter 20.

That is, a sampling clock signal generated on the basis of the composite synchronizing signal (CSYNC) needs to be synchronized with an analog video signal input to the A/D converter 20.

FIG. 3 is a timing chart illustrating an example of the horizontal synchronizing signal (HSYNC), the vertical synchronizing signal (VSYNC), and the composite synchronizing signal (CSYNC). As illustrated in FIG. 3, the horizontal synchronizing signal (HSYNC) has a pulse for each line, and the vertical synchronizing signal (VSYNC) has a pulse for each frame.

Since the composite synchronizing signal (CSYNC) is given by an AND of the horizontal synchronizing signal (HSYNC) and the vertical synchronizing signal (VSYNC), as in a section A, each frame includes a section A in which the composite synchronizing signal (CSYNC) is maintained at a low level (L level).

SUMMARY

According to an aspect of the embodiments, an apparatus includes a voltage controlled oscillator for outputting a clock signal having an oscillation frequency in accordance with an input voltage; a convertor for converting the analog video signal inputted from the exterior into the digital video signal synchronizing with the clock signal outputted from the voltage controlled oscillator; a phase difference detector for detecting a phase difference between the composite synchronizing signal in the analog video signal and a feedback signal which corresponds to the clock signal from the voltage-controlled oscillator; and a voltage control unit for controlling the input voltage of the voltage controlled oscillator to change in response to the phase difference detected by the phase difference detector when the phase difference is within the certain range, and to maintain the input voltage intact when the phase difference is in exceed of the certain range.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE EMBODIMENTS

[First Embodiment]

Figure 4:
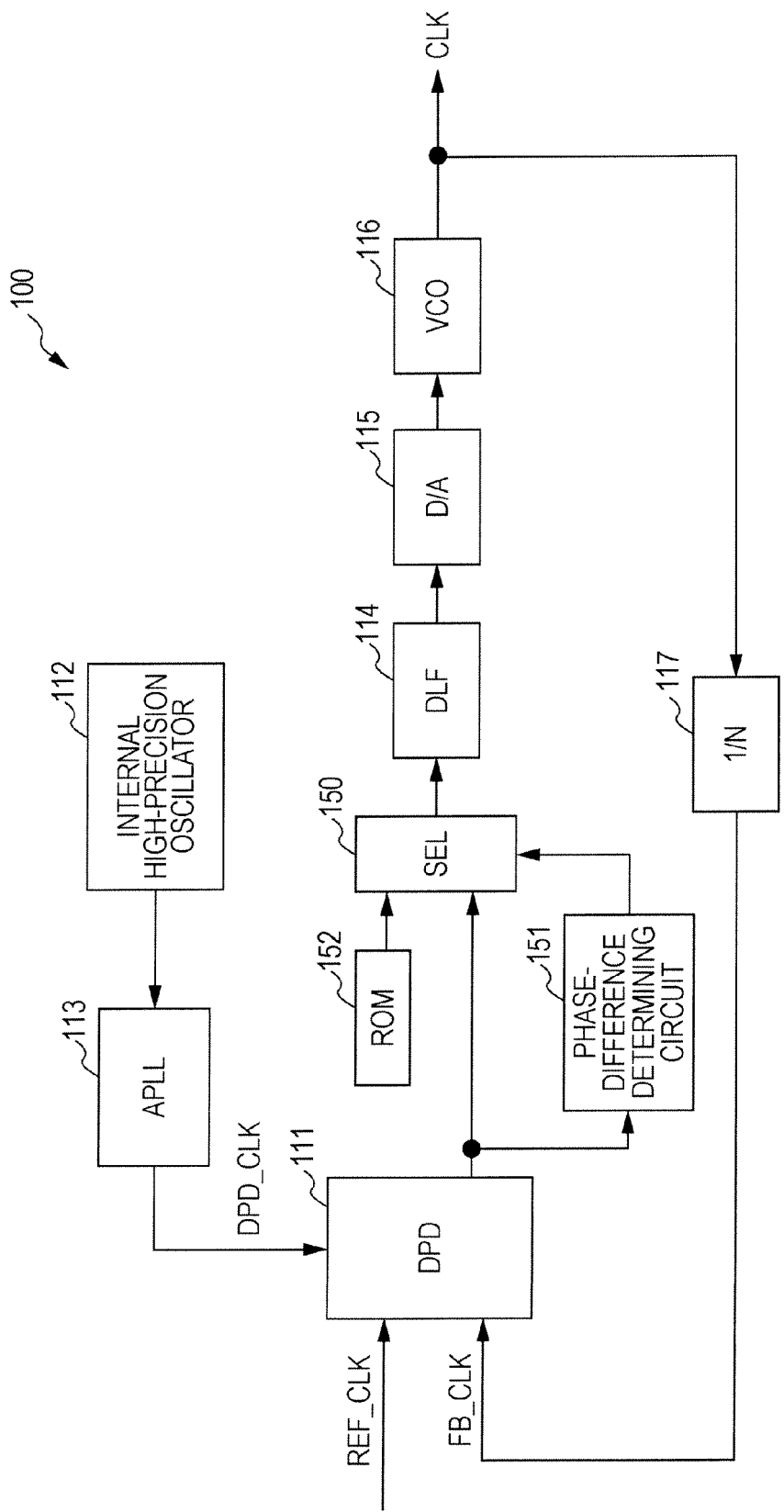
FIG. 4 is a block diagram illustrating a clock signal output apparatus according to a first embodiment.

FIG. 4 is a block diagram illustrating a clock signal output apparatus 100 of an analog-digital converting apparatus according to a first embodiment.

The clock signal output apparatus 100 of the first embodiment includes a digital phase detector (DPD) 111, an internal high-precision oscillator 112, an analog PLL (APLL) circuit 113, a selector 150, a phase-difference determining circuit 151, a read-only memory (ROM) 152, a digital loop filter (DLF) 114, a digital-to-analog (D/A) converter 115, a voltage-controlled oscillator (VCO) 116, and a frequency divider 117. The clock signal output apparatus 100 of the first embodiment is realized using, for example, an integrated circuit including electronic devices formed on a semiconductor substrate.

A composite synchronizing signal (CSYNC) used for controlling a video signal is input as a reference clock signal REF_CLK to the digital phase detector 111 included in the clock signal output apparatus 100 of the first embodiment.

A clock signal CLK output from the voltage-controlled oscillator 116 is used as a sampling clock signal used in sampling a video signal.

Therefore, a feedback clock signal FB_CLK supplied via the frequency divider 117 to the digital phase detector 111 is a feedback clock signal obtained by generating a signal whose frequency is a fraction of the frequency of a sampling clock signal used in controlling a video signal.

Therefore, the phase difference between the sampling clock signal and the composite synchronizing signal (CSYNC) can be detected by counting the phase difference between the feedback clock signal FB_CLK obtained by generating a signal whose frequency is a fraction of the frequency of the sampling clock signal and the reference clock signal REF_CLK (composite synchronizing signal (CSYNC)).

Figure 1:
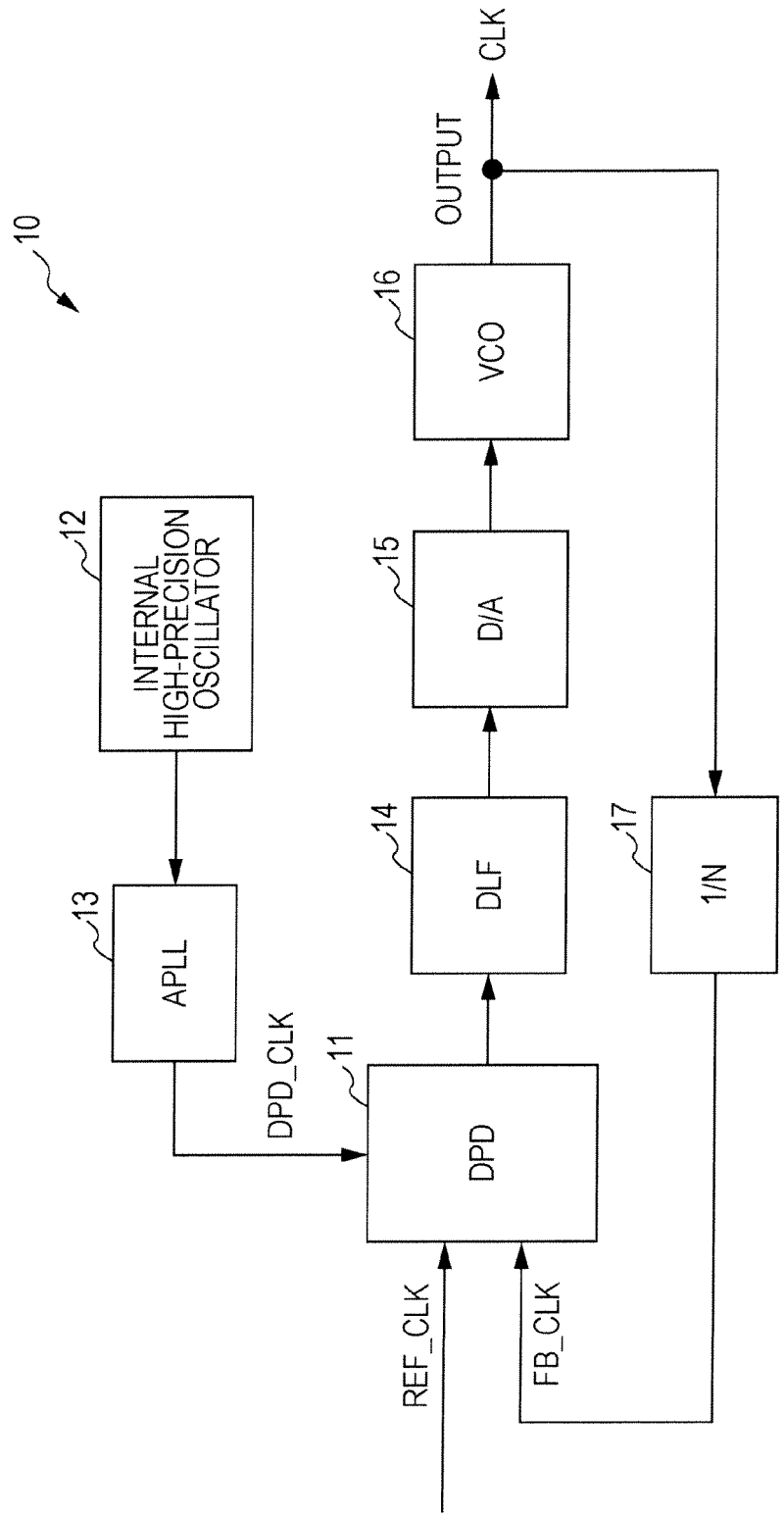
FIG. 1 is a block diagram illustrating a known clock signal output apparatus.
Figure 2:
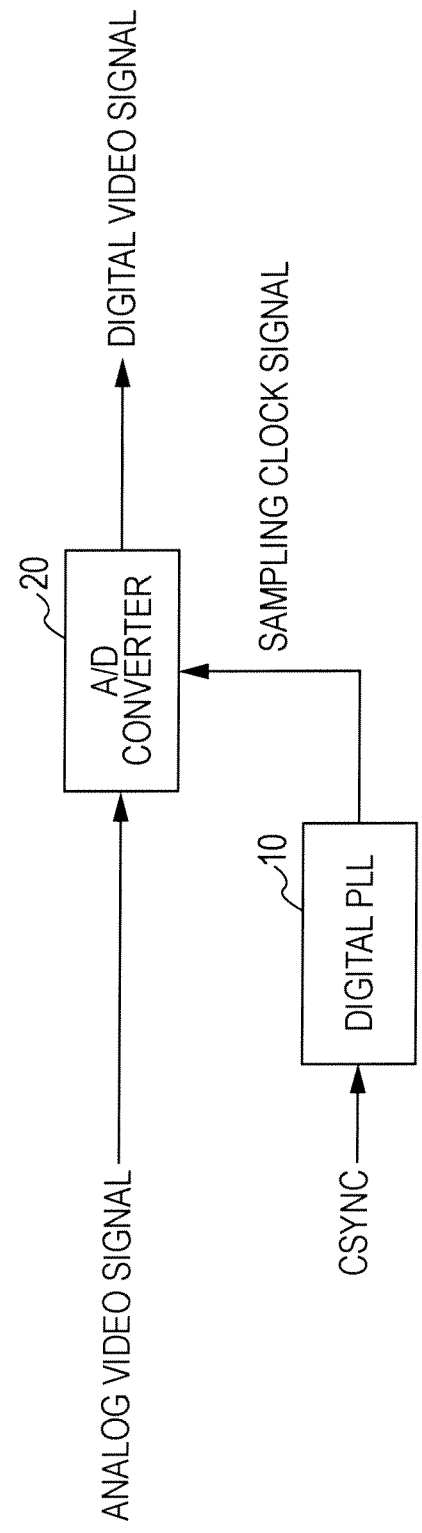
FIG. 2 is a block diagram illustrating an analog digital convert apparatus.

In the following description, the A/D converter 20 illustrated in FIG. 2 is used as an analog-digital converter that converts an analog video signal into a digital video signal by using a sampling clock signal.

The digital phase detector 111 counts the phase difference between a reference clock signal REF_CLK and a feedback clock signal FB_CLK and outputs a digital phase difference signal representing the phase difference. That is, a digital phase difference signal representing the phase difference between a composite synchronizing signal (CSYNC) and a feedback clock signal FB_CLK is output from the digital phase detector 111.

The digital phase detector 111 includes an analog phase detector that outputs the phase difference between a reference clock signal REF_CLK and a feedback clock signal FB_CLK, and a digital counter that counts the phase difference. The phase difference output from the analog phase detector is counted by using the digital counter, and the counted phase difference is output as a digital phase difference signal. For counting performed by the digital counter, a phase difference count clock signal DPD_CLK supplied from the internal high-precision oscillator 112 via the analog PLL circuit 113 is used.

The internal high-precision oscillator 112 is an oscillator for generating a phase difference count clock signal DPD_CLK used in counting the phase difference by using the digital counter in the digital phase detector 111. The phase difference count clock signal DPD_CLK is input to the digital phase detector 111 via the analog PLL circuit 113.

The selector 150 is a selector that selects and outputs one of a digital phase difference signal input from the digital phase detector 111 and a target value signal input from the ROM 152. The selector 150 can be realized as, for example, a circuit including a logic circuit or a three-state buffer.

When a determination result indicating that the digital phase difference signal is within a certain range is input from the phase-difference determining circuit 151, the selector 150 selects and outputs the digital phase difference signal input from the digital phase detector 111. In contrast, when a determination result indicating that the digital phase difference signal is not within the certain range is input from the phase-difference determining circuit 151, the selector 150 selects and outputs the target value signal input from the ROM 152.

The phase-difference determining circuit 151 is a phase-difference determining unit that determines whether a digital phase difference signal input from the digital phase detector 111 is within a certain range, and inputs a signal indicating the determination result to the selector 150. A combination logic circuit can be used as the phase-difference determining circuit 151 when the phase-difference determining circuit 151 performs a determination using firmware (program) or when the phase-difference determining circuit 151 is configured by using hardware.

The phase-difference determining circuit 151 has an upper threshold and a lower threshold for the phase difference between a reference clock signal REF_CLK and a feedback clock signal FB_CLK. The phase-difference determining circuit 151 determines whether a phase difference indicated by a digital phase difference signal input from the digital phase detector 111 is within a range defined by the upper threshold and the lower threshold.

Since the upper threshold is the upper threshold for the phase difference between the composite synchronizing signal (CSYNC) and the feedback clock signal FB_CLK, the upper threshold may be an appropriate value so that a digital video signal output from the A/D converter 20 has no jitter. the upper threshold is set in accordance with an operating environment.

Similarly, since the lower threshold is the lower threshold for the phase difference between the composite synchronizing signal (CSYNC) and the feedback clock signal FB_CLK, the lower threshold may be an appropriate value so that a digital video signal output from the A/D converter 20 has no jitter. The lower threshold is set in accordance with an operating environment.

The phase-difference determining circuit 151 inputs a signal representing a determination result indicating whether the phase difference represented by the digital phase difference signal is within the range defined by the upper threshold and the lower threshold to the selector 150. An output of the selector 150 is switched in response to the signal representing the determination result input from the phase-difference determining circuit 151.

The ROM 152 is a read-only memory that stores a target value signal. For example, a nonvolatile semiconductor memory can be used as the ROM 152. The ROM 152 stores data representing a target value of a digital phase difference signal. The target value serves as a target value signal that is one of two input signals of the selector 150.

The target value stored in the ROM 152 exists in between the upper threshold and the lower threshold, which define the certain range used for a determination made by the phase-difference determining circuit 151. The target value is for controlling the oscillation frequency of the voltage-controlled oscillator 116 when the phase difference between the composite synchronizing signal (CSYNC) and the feedback clock signal FB_CLK becomes outside the range defined by the upper threshold and the lower threshold.

The target value stored in the ROM 152 may be the mean value between the upper threshold and the lower threshold. Alternatively, the target value may be set to any appropriate value in between the upper threshold and the lower threshold. That is, the target value stored in the ROM 152 be set in accordance with an operating environment.

The digital loop filter 114 includes a processor such as a digital signal processor (DSP). The digital loop filter 114 averages error signals generated on the basis of a phase difference detected by the digital phase detector 111 (digital phase difference signal) and outputs the average.

The D/A converter 115 is a converter that converts the error signal output from the digital loop filter 114 into an analog signal and outputs the analog signal. The error signal output from the digital loop filter 114 is converted into an analog voltage value for controlling the oscillation frequency of the voltage-controlled oscillator 116. That is, the analog voltage value is set to a voltage value in accordance with the phase difference between the composite synchronizing signal (CSYNC) and the feedback clock signal FB_CLK.

The voltage-controlled oscillator 116 is an oscillator used as a slave oscillator. For example, an oscillator including an element such as a varicap diode that has a variable capacitance can be used as the voltage-controlled oscillator 16. By applying the analog voltage value output from the D/A converter 115 across the P-N junction of the varicap diode, a clock signal CLK with an oscillation frequency in accordance with the error signal output from the digital loop filter 114 is output. The clock signal CLK output from the voltage-controlled oscillator 116 is used as a sampling clock signal of the A/D converter 20 illustrated in FIG. 2.

The frequency divider 117 receives, as an input, the clock signal CLK output from the voltage-controlled oscillator 116 and outputs a feedback clock signal FB_CLK whose frequency is a fraction of the frequency of the clock signal CLK to the digital phase detector 111.

In the clock signal output apparatus 100 of the first embodiment as above, a clock signal CLK that is used as a sampling clock signal of the A/D converter 20 is output from the voltage-controlled oscillator 116. The clock signal CLK is input to the frequency divider 117 and is output as a feedback clock signal FB_CLK whose frequency is a fraction of the frequency of the clock signal CLK to the digital phase detector 111. Using the phase difference count clock signal DPD_CLK supplied from the internal high-precision oscillator 112 via the analog PLL circuit 113, the phase difference between the reference clock signal REF_CLK and the feedback clock signal FB_CLK is counted. Since the reference clock signal REF_CLK is a composite synchronizing signal (CSYNC), the counted phase difference is the phase difference between the composite synchronizing signal (CSYNC) and the feedback clock signal FB_CLK. The counted phase difference is output as a digital phase difference signal.

The selector 150 outputs a signal selected in accordance with a signal representing a determination result input from the phase-difference determining circuit 151. The selector 150 selects and outputs a digital phase difference signal input from the digital phase detector 111 when a determination result indicating that the digital phase difference signal is within the range defined by the upper threshold and the lower threshold is input from the phase-difference determining circuit 151. In contrast, the selector 150 selects and outputs a target value signal input from the ROM 152 when a determination result indicating that the digital phase difference signal is not within the range defined by the upper threshold and the lower threshold is input from the phase-difference determining circuit 151.

The digital loop filter 114 averages error signals generated on the basis of the digital phase difference signal or the target value signal output from the selector 150, and inputs an error signal serving as the average to the D/A converter 115.

The D/A converter 115 converts the error signal output from the digital loop filter 114 into an analog signal (analog voltage value) and supplies the analog voltage value to the voltage-controlled oscillator 116.

The analog voltage value supplied from the D/A converter 115 to the voltage-controlled oscillator 116 is applied across the P-N junction of the varicap diode, thereby changing the capacitance of the varicap diode. Thus, a clock signal CLK with an oscillation frequency in accordance with the error signal output from the digital loop filter 114 is output from the voltage-controlled oscillator 116.

According to the clock signal output apparatus 100 of the first embodiment, the digital phase detector 111 detects the phase difference between a composite synchronizing signal (CSYNC) and a feedback clock signal FB_CLK. When the phase difference is within the range defined by the upper threshold and the lower threshold, the selector 150 selects and outputs the digital phase difference signal. In contrast, when the phase difference is not within the range defined by the upper threshold and the lower threshold, the selector 150 selects and outputs the target value stored in the ROM 152.

Therefore, when the phase difference is within the range defined by the upper threshold and the lower threshold, the digital loop filter 114 averages error signals generated on the basis of the digital phase difference signal, and inputs an error signal serving as the average to the D/A converter 115. As a result, an analog voltage value based on the phase difference between the composite synchronizing signal (CSYNC) and the feedback clock signal FB_CLK is supplied from the D/A converter 115 to the voltage-controlled oscillator 116 and is applied across the P-N junction of the varicap diode included in the voltage-controlled oscillator 116. Control is performed so that the frequency of a clock signal CLK output from the voltage-controlled oscillator 116 becomes synchronized with the reference clock signal REF_CLK. The clock signal CLK obtained in this manner is synchronized with an analog video signal input to the A/D converter 20 illustrated in FIG. 2.

In contrast, when the phase difference is not within the range defined by the upper threshold and the lower threshold, the output of the selector 150 is switched to the target value stored in the ROM 152 in response to a signal representing the determination result obtained by the phase-difference determining circuit 151. Accordingly, the digital loop filter 114 averages error signals generated on the basis of the target value, and inputs an error signal serving as the average to the D/A converter 115. As a result, an analog voltage value based on the target value is supplied from the D/A converter 115 to the voltage-controlled oscillator 116 and is applied across the P-N junction of the varicap diode included in the voltage-controlled oscillator 116. The frequency of a clock signal CLK output from the voltage-controlled oscillator 116 is controlled. The clock signal CLK obtained in this manner is synchronized with an analog video signal input to the A/D converter 20 illustrated in FIG. 2.

According to the clock signal output apparatus 100 of the first embodiment as above, when the phase difference between a composite synchronizing signal (CSYNC) and a feedback clock signal FB_CLK is not within the range defined by the upper threshold and the lower threshold, the oscillation frequency of the voltage-controlled oscillator 116 is controlled by using the target value of the phase difference.

Figure 3:
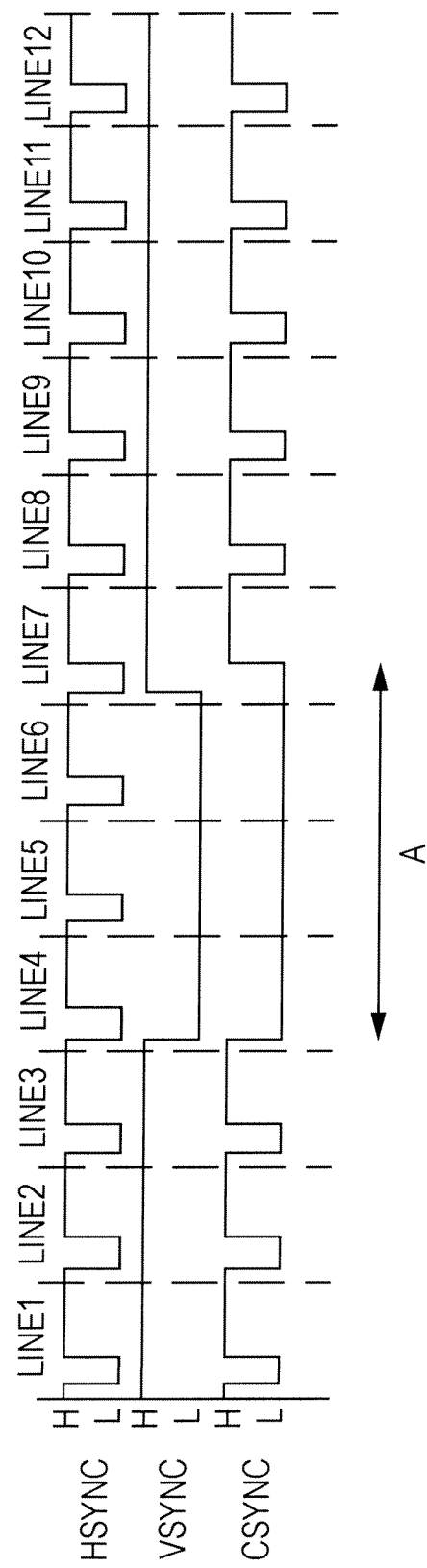
FIG. 3 is a timing chart illustrating an example of a horizontal synchronizing signal (HSYNC), a vertical synchronizing signal (VSYNC), and a composite synchronizing signal (CSYNC)

Therefore, as in a section An illustrated in FIG. 3, there is a section in which a composite synchronizing signal (CSYNC) is maintained at a low level (L level). Even when the phase difference between a composite synchronizing signal (CSYNC) and a feedback clock signal FB_CLK is not within the range defined by the upper threshold and the lower threshold, the clock signal CLK is generated so as be synchronized with an analog video signal input to the A/D converter 20 illustrated in FIG. 2.

Therefore, when a clock signal CLK generated by using a composite synchronizing signal (CSYNC) as a reference clock signal REF_CLK is used as a sampling clock signal, distortion such as jitter of a digital video signal obtained by the A/D converter 20 can be suppressed.

[Second Embodiment]

Figure 5:
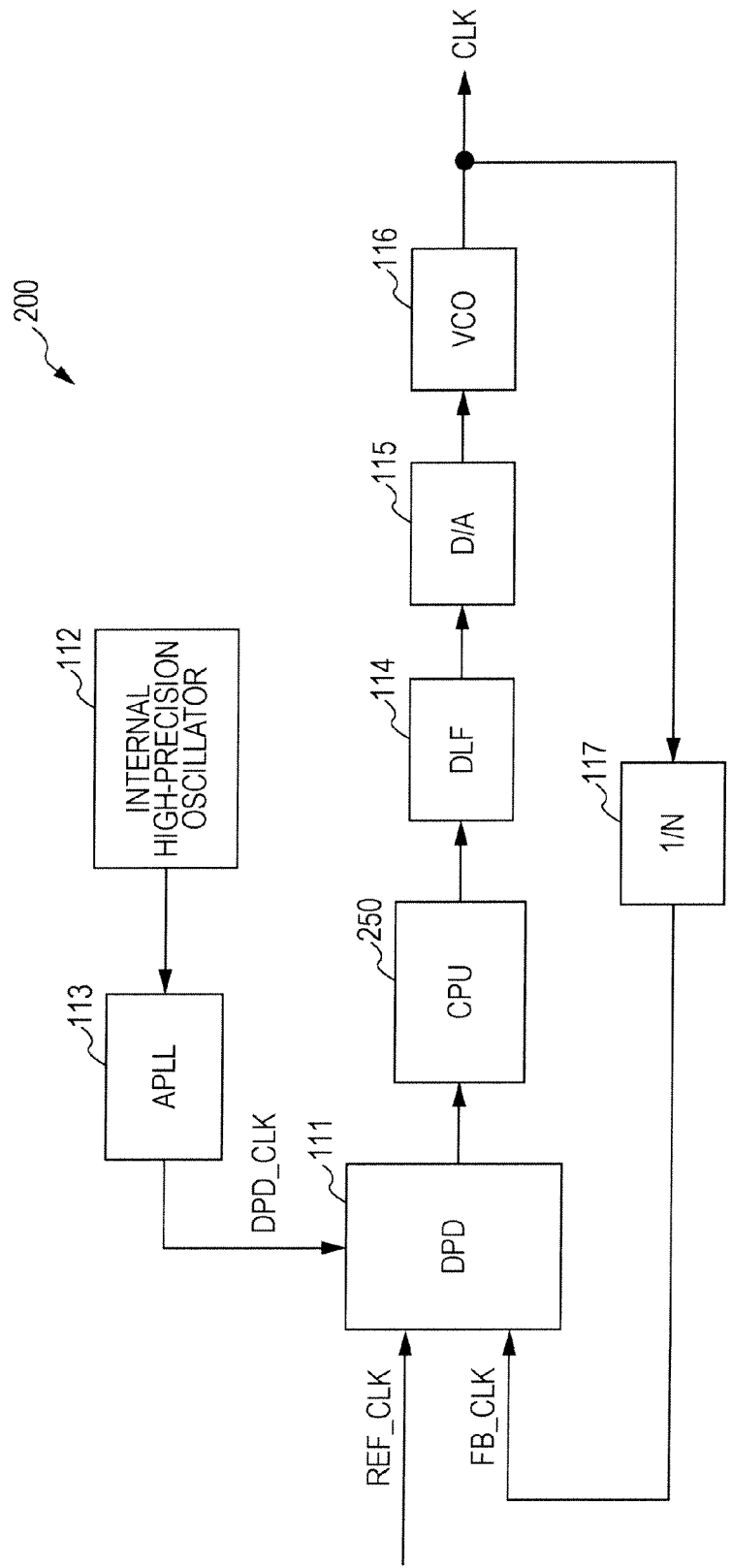
FIG. 5 is a block diagram illustrating a clock signal output apparatus according to a second embodiment.

FIG. 5 is a block diagram illustrating a clock signal output apparatus 200 according to a second embodiment. The clock signal output apparatus 200 of the second embodiment includes a central processing unit (CPU) 250 in place of the selector 150 which is a selector output unit, the phase-difference determining circuit 151, and the ROM 152 of the clock signal output apparatus 100 of the first embodiment.

The CPU 250 can realize the same functions as the selector 150, the phase-difference determining circuit 151, and the ROM 152 of the first embodiment by executing a certain program.

Therefore, the CPU 250 has a function of selecting and outputting one of a digital phase difference signal input from the digital phase detector 111 and a target value signal input from the ROM 152 (function corresponding to the selector 150 of the first embodiment).

Also, the CPU 250 has a function of determining whether a digital phase difference signal input from the digital phase detector 111 is within a certain range (function corresponding to the phase-difference determining circuit 151 of the first embodiment).

Also, the CPU 250 has an internal memory and stores data representing a target value stored in the ROM 152 of the first embodiment, and a program for realizing the same functions as those of the selector 150, the phase-difference determining circuit 151, and the ROM 152 of the first embodiment.

Figure 6:
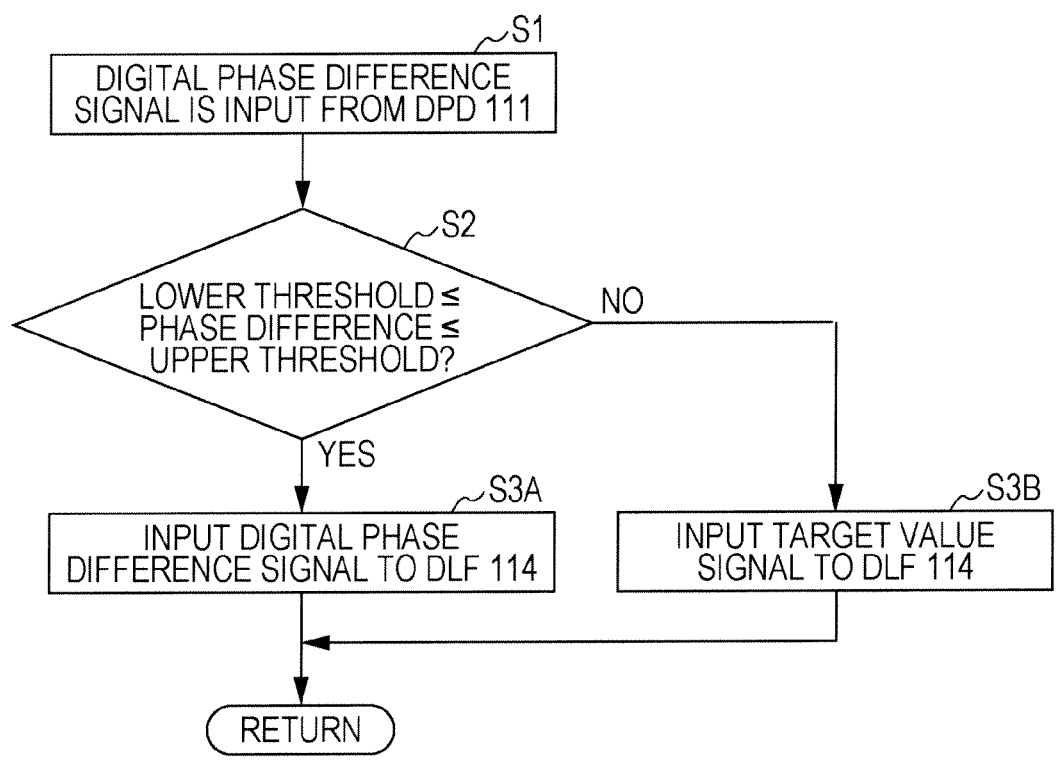
FIG. 6 is a flowchart illustrating a process executed by a CPU included in the clock signal output apparatus according to the second embodiment.

FIG. 6 is a flowchart illustrating a process executed by the CPU 250 included in the clock signal output apparatus 200 of the second embodiment. This process is executed by the CPU 250 when the phase difference between a reference clock signal REF_CLK and a feedback clock signal FB_CLK is counted by using the digital phase detector 111 and a digital phase difference signal representing the phase difference is input to the CPU 250. After a digital phase difference signal or a target value signal is input to the digital loop filter 114, when the digital phase detector 111 inputs a phase difference signal again, the CPU 250 repeats the execution of the process illustrated in FIG. 6.

The CPU 250 starts the process when a digital phase difference signal is input from the digital phase detector 111 (step S1).

Next, the CPU 250 determines whether a phase difference represented by the digital phase difference signal is within the range defined by the upper threshold and the lower threshold (step S2).

When it is determined that the phase difference represented by the digital phase difference signal is within the range defined by the upper threshold and the lower threshold, the CPU 250 inputs the digital phase difference signal input from the digital phase detector 111 to the digital loop filter 114 (step S3A).

In contrast, when it is determined that the phase difference represented by the digital phase difference signal is not within the range defined by the upper threshold and the lower threshold, the CPU 250 reads, instead of the digital phase difference signal input from the digital phase detector 111, data representing a target value stored in the internal memory, and inputs the target value as a target value signal to the digital loop filter 114 (step S3B).

When the digital phase difference signal or the target value signal is input from the CPU 250, the digital loop filter 114 averages error signals generated on the basis of the digital phase difference signal or the target value signal, and inputs an error signal serving as the average to the D/A converter 115, as is the case with the clock signal output apparatus 100 of the first embodiment.

The D/A converter 115 converts the error signal output from the digital loop filter 114 into an analog signal (analog voltage value) and supplies the analog voltage value to the voltage-controlled oscillator 116.

The analog voltage value supplied from the D/A converter 115 to the voltage-controlled oscillator 116 is applied across the P-N junction of the varicap diode, thereby changing the capacitance of the varicap diode. Thus, a clock signal CLK with an oscillation frequency in accordance with the error signal output from the digital loop filter 114 is output from the voltage-controlled oscillator 116.

According to the clock signal output apparatus 200 of the second embodiment, the digital phase detector 111 detects the phase difference between a composite synchronizing signal (CSYNC) and a feedback clock signal FB_CLK. When the phase difference is within the range defined by the upper threshold and the lower threshold, the CPU 250 selects and outputs the digital phase difference signal. In contrast, when the phase difference is not within the range defined by the upper threshold and the lower threshold, the CPU 250 selects and outputs the target value signal.

Therefore, when the phase difference is within the range defined by the upper threshold and the lower threshold, the digital loop filter 114 averages error signals generated on the basis of the digital phase difference signal, and inputs an error signal serving as the average to the D/A converter 115. As a result, an analog voltage value based on the phase difference between the composite synchronizing signal (CSYNC) and the feedback clock signal FB_CLK is supplied from the D/A converter 115 to the voltage-controlled oscillator 116 and is applied across the P-N junction of the varicap diode included in the voltage-controlled oscillator 116. Control is performed so that the frequency of a clock signal CLK output from the voltage-controlled oscillator 116 becomes synchronized with the reference clock signal REF_CLK. The clock signal CLK obtained in this manner is synchronized with an analog video signal input to the A/D converter 20 illustrated in FIG. 2.

In contrast, when the phase difference is not within the range defined by the upper threshold and the lower threshold, the output of the CPU 250 is switched to the target value signal. Accordingly, the digital loop filter 114 averages error signals generated on the basis of the target value, and inputs an error signal serving as the average to the D/A converter 115. As a result, an analog voltage value based on the target value is supplied from the D/A converter 115 to the voltage-controlled oscillator 116 and is applied across the P-N junction of the varicap diode included in the voltage-controlled oscillator 116. The frequency of a clock signal CLK output from the voltage-controlled oscillator 116 is controlled. The clock signal CLK obtained in this manner is synchronized with an analog video signal input to the A/D converter 20 illustrated in FIG. 2.

According to the clock signal output apparatus 200 of the second embodiment as above, when the phase difference between a composite synchronizing signal (CSYNC) and a feedback clock signal FB_CLK is not within the range defined by the upper threshold and the lower threshold, the oscillation frequency of the voltage-controlled oscillator 116 is controlled by using the target value of the phase difference.

Therefore, as in a section An illustrated in FIG. 3, there is a section in which a composite synchronizing signal (CSYNC) is maintained at a low level (L level). Even when the phase difference between a composite synchronizing signal (CSYNC) and a feedback clock signal FB_CLK is not within the range defined by the upper threshold and the lower threshold, the clock signal CLK is generated so as be synchronized with an analog video signal input to the A/D converter 20 illustrated in FIG. 2.

Therefore, when a clock signal CLK generated by using a composite synchronizing signal (CSYNC) as a reference clock signal REF_CLK is used as a sampling clock signal, distortion such as jitter of a digital video signal obtained by the A/D converter 20 can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analog-digital converting apparatus for converting an analog video signal inputted from an exterior containing a composite synchronizing signal into a digital video signal, comprising:
a voltage controlled oscillator for outputting a clock signal having an oscillation frequency in accordance with an input voltage;
a convertor for converting the analog video signal inputted from the exterior into the digital video signal synchronized with the clock signal outputted from the voltage controlled oscillator;
a phase difference detector for detecting a phase difference between the composite synchronizing signal in the analog video signal and a feedback signal which corresponds to the clock signal from the voltage-controlled oscillator; and
a voltage control unit for controlling the input voltage of the voltage controlled oscillator to change in response to the phase difference detected by the phase difference detector when the phase difference is within a certain range, and to maintain the input voltage intact when the phase difference is in exceed of the certain range.

2. The analog-digital converting apparatus according to claim 1, wherein the phase difference detector outputs a first value corresponding to the detected phase difference, and
the voltage control unit includes:
a selector for selecting either the first value or a second value which is predetermined value, the selector selecting the first value when the phase difference is within the certain range, the selector selecting the second value when the phase difference is in exceed of the certain range; and a voltage output unit for outputting the input voltage corresponding to the value selected by the selector to the voltage controlled oscillator.

3. The analog-digital converting apparatus according to claim 2, wherein the voltage control unit further includes a memory storing the second value, and the selector selects the second value in the memory when the phase difference is in exceeding of the certain range.

4. The analog-digital converting apparatus according to claim 1, wherein the phase difference detector outputs a first value corresponding to the detected phase difference, and the voltage control unit includes:

a processor for processing, selecting the first value when the phase difference is within the certain range, and selecting the second value when the phase difference is in exceeding of the certain range; and a voltage output unit for outputting the input voltage corresponding to the value selected by the processor to the voltage controlled oscillator.

5. A clock signal output apparatus for outputting a clock signal to an analog-digital convertor, the analog-digital convertor converting an analog video signal inputted from an exterior into a digital video signal synchronized with the clock signal, the clock signal output apparatus comprising:

a voltage controlled oscillator for outputting the clock signal having an oscillation frequency in accordance with an input voltage;

a phase difference detector for detecting a phase difference between the composite synchronizing signal in the analog video signal and a feedback signal which corresponds to the clock signal from the voltage-controlled oscillator; and a voltage control unit for controlling the input voltage of the voltage controlled oscillator to change in response to the phase difference detected by the phase difference detector when the phase difference is within a certain range, and to maintain the input voltage intact when the phase difference is in exceed of the certain range.

6. The clock signal output apparatus according to claim 5, wherein the phase difference detector outputs a first value corresponding to the detected phase difference, and the voltage control unit includes:

a selector for selecting either the first value or a second value which is predetermined value, the selector selecting the first value when the phase difference is within the certain range, the selector selecting the second value when the phase difference is in exceed of the certain range; and a voltage output unit for outputting the input voltage corresponding to the value selected by the selector to the voltage controlled oscillator.

7. The clock signal output apparatus according to claim 6, wherein the voltage control unit further includes a memory storing the second value, and the selector selects the second value in the memory when the phase difference is in exceeding of the certain range.

8. The clock signal output apparatus according to claim 5, wherein the phase difference detector outputs a first value corresponding to the detected phase difference, and the voltage control unit includes:

a processor for processing, selecting the first value when the phase difference is within the certain range, and selecting the second value when the phase difference is in exceeding of the certain range; and a voltage output unit for outputting the input voltage corresponding to the value selected by the processor to the voltage controlled oscillator.

* * * * *